(12) United States Patent
Itakura et al.

(10) Patent No.: US 7,495,460 B2
(45) Date of Patent: Feb. 24, 2009

(54) BODY FOR KEEPING A WAFER, HEATER UNIT AND WAFER PROBER

(75) Inventors: Katsuhiro Itakura, Itami (JP); Masuhiro Natsuhara, Itami (JP); Hirohiko Nakata, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 11/498,966

(22) Filed: Aug. 4, 2006

(65) Prior Publication Data
US 2007/0046307 A1 Mar. 1, 2007

(30) Foreign Application Priority Data
Aug. 5, 2005 (JP) ............... 2005-227333

(51) Int. Cl.
*G01R 31/02* (2006.01)
(52) U.S. Cl. .................................... 324/760
(58) Field of Classification Search ................ 324/760, 324/765, 158.1; 392/376, 361, 362, 422–423; 361/234
See application file for complete search history.

(56) References Cited

U.S. PATENT DOCUMENTS

| | | | | |
|---|---|---|---|---|
| 1,555,268 A | * | 9/1925 | Colby | ......................... 392/376 |
| 5,793,019 A | * | 8/1998 | Boyle et al. | ................... 219/400 |
| 6,549,026 B1 | * | 4/2003 | DiBattista et al. | ............. 324/760 |
| 6,740,853 B1 | * | 5/2004 | Johnson et al. | ........... 219/444.1 |
| 6,761,796 B2 | * | 7/2004 | Srivastava et al. | ....... 156/345.38 |
| 2006/0098379 A1 | * | 5/2006 | Otaka et al. | ................. 361/234 |

FOREIGN PATENT DOCUMENTS

| | | |
|---|---|---|
| JP | 7-169824 | 7/1995 |
| JP | 9-63973 | 3/1997 |
| JP | 9-119868 | 5/1997 |
| JP | 2001-33484 A | 2/2001 |
| JP | 2004-140347 | 5/2004 |

OTHER PUBLICATIONS

Japanese Office Action, with English translation, issued in Japanese Patent Application No. JP 2005-227333, mailed Jul. 1, 2008.

* cited by examiner

*Primary Examiner*—Ha Tran T Nguyen
*Assistant Examiner*—Tung X Nguyen
(74) *Attorney, Agent, or Firm*—McDermott Will & Emery LLP

(57) ABSTRACT

A wafer holding body used for a wafer prober for testing a semiconductor wafer includes a chuck top having a conductive layer on a surface thereof and a support body supporting the chuck top. The support body has a base portion opposing the chuck top and a side portion extending from the perimeter of the base portion to the chuck top to support the chuck top. A cavity portion is formed between the chuck top and the base portion of the support body. A reflection plate is provided in the cavity portion. A heater unit and a wafer prober includes the wafer holding body.

10 Claims, 5 Drawing Sheets

BODY FOR KEEPING A WAFER, HEATER UNIT AND WAFER PROBER

This nonprovisional application is based on Japanese Patent Applications No. 2005-227333 filed with the Japan Patent Office on Aug. 5, 2005, the entire contents of which are hereby incorporated by reference.

BACKGROUND OF THE INVENTION

1. Field of the Invention

The present invention relates to a wafer holding body for use in a wafer prober for testing a semiconductor wafer, a heater unit including the wafer holding body and a wafer prober.

2. Description of the Background Art

Conventionally, in a step of testing a semiconductor wafer, a heating process is performed on a semiconductor wafer as a process target. Here, a burn-in step is performed in which a semiconductor wafer is heated to a temperature higher than a normally used temperature to accelerate a defect in a semiconductor chip that is potentially defective for removal in order to prevent a defective after shipment.

In this burn-in step, before a semiconductor wafer having a circuit formed therein is cut into individual semiconductor chips, the electric characteristics of each semiconductor chip are determined while the semiconductor wafer is heated, thereby removing a defective. In this burn-in step, reduction of the process time is strongly requested in order to improve a throughput.

In such a burn-in step, a heater unit for heating a semiconductor wafer is used which includes a wafer holding body for holding a semiconductor wafer. The wafer holding body used in a conventional heater unit uses a flat plate-like metal plate so that the entire back surface of a semiconductor wafer should be brought into contact with a ground electrode.

In the burn-in step, a semiconductor wafer having a circuit formed therein is placed on a wafer-placing surface of the wafer holding body which is a metal plate in order to determine the electric characteristics of a semiconductor wafer. In determining the electric characteristics of a semiconductor chip, a determiner called a probe card including a number of probe pins for supplying power is pressed against a semiconductor wafer at a force of a few tens of kgf to a few hundreds of kgf.

SUMMARY OF THE INVENTION

Recently, with miniaturization in semiconductor processes, the load per unit area of a semiconductor chip in probing is increased and in addition, the accuracy in registration of a probe card with a wafer holding body is required. The wafer holding body usually repeats an operation of heating a semiconductor wafer at a prescribed temperature, moving to a prescribed position in probing, and pressing a probe card against the semiconductor wafer. Here, high accuracy is also required of a driving system for moving the wafer holding body to a prescribed position.

However, when a semiconductor wafer is heated to a prescribed temperature, for example, a temperature of 100-200° C., the heat is transferred to the driving system provided below the wafer holding body, causing thermal expansion of metal parts that constitute the driving system. This reduces the accuracy of the driving system.

An object of the present invention is to provide a wafer holding body, a heater unit including the same, and a wafer prober, in which the accuracy of the driving system below the wafer holding body can be improved by effectively suppressing a temperature rise at the bottom of the wafer holding body even when a semiconductor wafer placed at the top of the wafer holding body is heated.

In accordance with the present invention, a wafer holding body used for a wafer prober for testing a semiconductor wafer includes a chuck top including a conductive layer on a surface thereof and a support body supporting the chuck top. The support body has a base portion opposing the chuck top and a side portion extending from a perimeter of the base portion to the chuck top to support the chuck top. A cavity portion is formed between the chuck top and the base portion of the support body. A reflection plate is provided in the cavity portion.

In the wafer holding body in accordance with the present invention, preferably, the emissivity of that surface of the reflection plate which opposes the chuck top is at most 0.5.

In the wafer holding body in accordance with the present invention, preferably, the reflection plate is made of at least one kind selected from the group consisting of stainless steel, aluminum, and nickel.

Preferably, a distance between that surface of the reflection plate which opposes the chuck top and that surface of the chuck top which opposes the reflection plate, and a distance between that surface of the reflection plate which opposes the base portion of the support body and that surface of the base portion of the support body which opposes the reflection plate each are at least 1 mm.

In the wafer holding body in accordance with the present invention, preferably, that surface of the reflection plate which opposes the chuck top and that surface of the chuck top which opposes the reflection plate each are circular, and a diameter of that surface of the reflection plate which opposes the chuck top is smaller than a diameter of that surface of the chuck top which opposes the reflection plate.

In the wafer holding body in accordance with the present invention, preferably, that surface of the reflection plate which opposes the chuck top has flatness of at most 1 mm.

In the wafer holding body in accordance with the present invention, preferably, that surface of the reflection plate which opposes the chuck top has surface roughness Ra of at most 1 μm.

In the wafer holding body in accordance with the present invention, preferably, a metal layer is formed on at least a part of an inner wall surface of the cavity portion.

The wafer holding body in accordance with the present invention preferably includes cooling means in the cavity portion.

The wafer holding body in accordance with the present invention preferably includes cooling means at the base portion of the support body.

The wafer holding body in accordance with the present invention preferably includes a heating element provided at the chuck top for heating the chuck top.

In the wafer holding body in accordance with the present invention, preferably, the support body is shaped like a cylinder with a base.

In accordance with the present invention, a heater unit used for a wafer prober for testing a semiconductor wafer includes the wafer holding body as described above.

In accordance with the present invention, a wafer prober includes the heater unit as described above.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
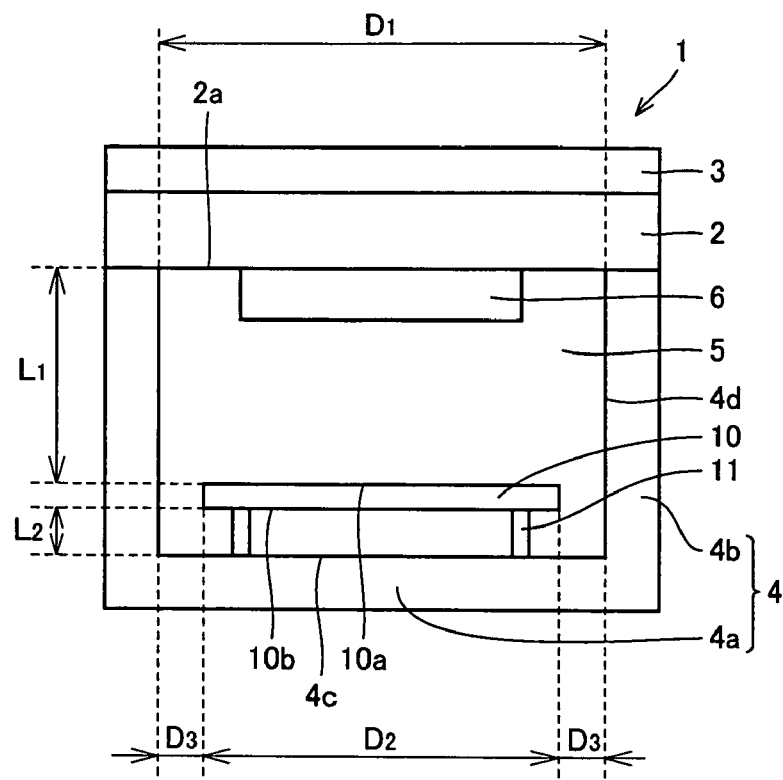
FIG. 1 is a schematic cross sectional view of an exemplary wafer holding body in accordance with the present invention.

In the following, an embodiment of the present invention will be described. It is noted that in the figures of the present invention, the same parts or corresponding parts will be denoted with the same reference characters.

FIG. 1 shows a schematic cross sectional view of an exemplary wafer holding body in accordance with the present invention. Here, a wafer holding body 1 in accordance with the present invention has a disk-like chuck top 2 as a main body of the wafer holding body and a support body 4 supporting chuck top 2. A chuck top conductive layer 3 is formed on the surface of chuck top 2.

Here, support body 4 is shaped like a cylinder with a base including a base portion 4a opposing chuck top 2 and a cylinder-shaped side portion 4b extending from the perimeter of base portion 4a toward chuck top 2 to support chuck top 2. In addition, a hollow cavity portion 5 is formed between a surface 4c of base portion 4a of support body 4 that opposes chuck top 2 and a surface 2a of chuck top 2 that opposes base portion 4a of support body 4. Cavity portion 5 is filled with the air.

Furthermore, a heater body 6 for heating chuck top 2 is installed in such a manner as to be attached to surface 2a of chuck top 2. A reflection plate 10 is installed on a strut 11 attached to base portion 4a of support body 4.

In wafer holding body 1 having such a configuration, a semiconductor wafer is provided on the surface of chuck top conductive layer 3. Even when this semiconductor wafer is heated by heater body 6 with chuck top 2 and chuck top conductive layer 3 interposed, the synergistic effect of cavity portion 5 filled with the air and reflection plate 10 effectively prevents heat generated from chuck top 2 heated by heater body 6 from being transferred to base portion 4a of support body 4.

Therefore, in this wafer holding body 1, even when a semiconductor wafer placed on the surface of chuck top conductive layer 3 at the top of wafer holding body 1 is heated, a temperature rise in base portion 4a of support body 4 at the bottom of wafer holding body 1 can effectively be prevented. Thus, the accuracy of a driving system below wafer holding body 1 can be improved.

More specifically, in wafer holding body 1, conduction of heat generated from chuck top 2 heated by heater body 6 is suppressed by the air included in cavity portion 5. Even if the heat reaches the surface of reflection plate 10, it is reflected by a surface 10a of reflection plate 10 that opposes chuck top 2, so that contribution of heat of chuck top 2 to the temperature rise in base portion 4a of support body 4 can be suppressed.

Here, the shape of reflection plate 10 is not specifically limited. For example, the shape may be formed to effectively suppress heat transfer from chuck top 2 to base portion 4a of support body 4.

The shape of support body 4 is also not specifically limited. Preferably, support body 4 is shaped like a cylinder with a base as described above. In this case, the contact area between chuck top 2 and support body 4 can be reduced, and in addition, larger cavity portion 5 can be formed. Therefore, the amount of heat transfer from chuck top 2 to support body 4 is likely to be reduced.

Preferably, the emissivity of surface 10a of reflection plate 10 opposing chuck top 2 is 0.5 or less. If the emissivity exceeds 0.5, the heat generated in chuck top 2 is more likely to be absorbed in reflection plate 10 because of radiation so that the temperature of reflection plate 10 tends to increase largely. In particular, if chuck top 2 is heated for a long time at a high temperature of about 200° C., the temperature rise of reflection plate 10 is remarkable. When the temperature of reflection plate 10 rises, the heat of reflection plate 10 is transferred to base portion 4a of support body 4 thereby increasing the possibility of increasing the temperature of base portion 4a of support body 4.

Here, the material of reflection plate 10 is not specifically limited. Preferably, reflection plate 10 is made of at least one kind selected from the group consisting of stainless steel, aluminium and nickel. If reflection plate 10 is exposed to a high temperature for a long time, the surface state of surface 10a of reflection plate 10 changes so that the emissivity thereof tends to increase. However, at least one kind selected from the group consisting of stainless steel, aluminium and nickel is stable to heat or oxidation, so that reflection plate 10 is preferably made of at least one kind selected from the group consisting of stainless steel, aluminium and nickel. It is noted that if two or more kinds selected from the group consisting of stainless steel, aluminium and nickel are used as the material of reflection plate 10, reflection plate 10 may be in the form of a composite having a stacked structure formed by successively stacking layers made of these metals or an alloy of these metals.

Preferably, a distance $L_1$ between surface 10a of reflection plate 10 opposing chuck top 2 and surface 2a of chuck top 2 opposing reflection plate 10 and a distance $L_2$ between surface 10b of reflection plate 10 opposing base portion 4a of support body 4 and surface 4c of base portion 4a of support body 4 opposing reflection plate 10 each are 1 mm or more. If distance $L_1$ between surface 10a of reflection plate 10 and surface 2a of chuck top 2 is less than 1 mm, the heat of chuck top 2 is transferred to reflection plate 10 through the air included in cavity portion 5 to increase the temperature of reflection plate 10, so that reflection plate 10 may not serve to block the heat of chuck top 2. On the other hand, if distance $L_2$ between surface 10b of reflection plate 10 and surface 4c of base portion 4a of support body 4 is less than 1 mm, the heat of reflection plate 10 transfers to base portion 4a of support body 4 more easily, so that the temperature of base portion 4a of support body 4 tends to increase.

When surface 10a of reflection plate 10 that opposes chuck top 2 and surface 2a of chuck top 2 that opposes reflection plate 10 each are circular, a diameter $D_2$ of surface 10a of reflection plate 10 that opposes chuck top 2 is preferably smaller than a diameter $D_1$ of surface 2a of chuck top 2 that opposes reflection plate 10. In this case, an area $S_2$ ($S_2=\pi(D_2/2)^2$) of surface 10a of reflection plate 10 that opposes chuck top 2 is preferably 50% or more of an area $S_1$ ($S_1=\pi(D_1/2)^2$) of surface 2a of chuck top 2 that opposes reflection plate 10. If area $S_2$ of surface 10a of reflection plate 10 is less than 50% of area $S_1$ of surface 2a of chuck top 2, the convection of the gas inside cavity portion 5 cannot be interrupted sufficiently. Thus, the amount of heat transfer by the convection increases, and in addition, the radiation between chuck top 2 and base portion 4a of support body 4 passes through the portion that is not covered with reflection plate 10. Thus, the heat transfer cannot be blocked effectively.

Preferably, a distance $D_3$ between reflection plate 10 and an inner wall surface 4d of side portion 4b of support body 4 is 1 mm or more. If this distance $D_3$ is less than 1 mm, the heat of reflection plate 10 is more easily transferred to support body 4, so that it is likely that the temperature rise of support body 4 cannot be suppressed effectively.

Preferably, the flatness of surface 10a of reflection plate 10 that opposes chuck top 2 is 1 mm or less. If the flatness of surface 10a of reflection plate 10 exceeds 1 mm, the temperature distribution at the surface of chuck top 2 tends to vary.

Preferably, surface roughness Ra of surface 10a of reflection plate 10 that opposes chuck top 2 is 1 μm or less, more preferably 0.5 μm or less. If the surface roughness Ra of surface 10a of reflection plate 10 exceeds 1 μm, the surface area of surface 10a of reflection plate 10 increases. Therefore, the temperature of reflection plate 10 more easily changes depending on the surrounding temperature, resulting in an increased amount of heat transfer between chuck top 2 and base portion 4a of support body 4. On the other hand, the surface roughness Ra of surface 10a of reflection plate 10 is 1 μm or less, in particular, 0.5 μm or less, it is likely that the amount of heat transfer between chuck top 2 and base portion 4a of support body 4 can be reduced. It is noted that surface roughness Ra refers to arithmetic mean roughness Ra defined by JIS B 0601.

Figure 2:
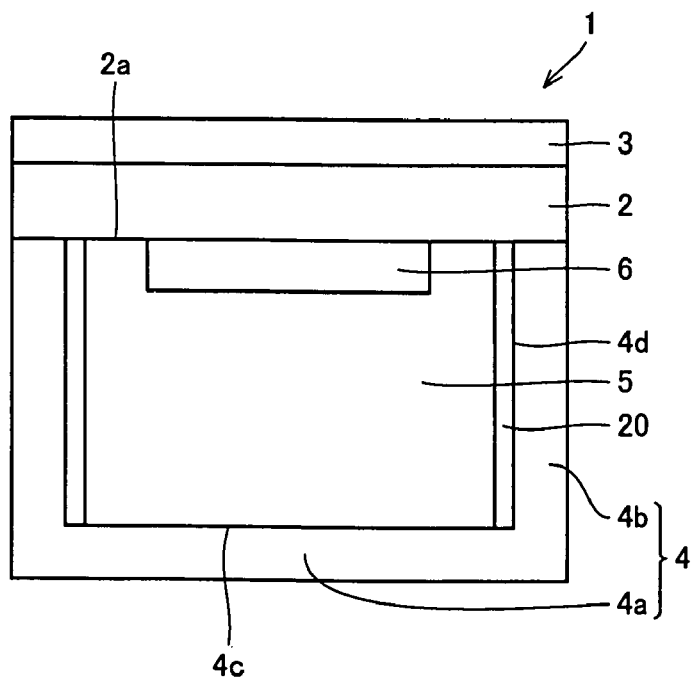
FIG. 2 is a schematic cross sectional view of another example of a wafer holding body in accordance with the present invention.

Preferably, a metal layer is formed on at least a part of the inner wall face of cavity portion 5 (here, all the surfaces of surface 4c of base portion 4a and inner wall surface 4d of side portion 4b of support body 4). FIG. 2 shows a schematic cross sectional view of another exemplary wafer holding body in accordance with the present invention. Here, a metal layer 20 is formed on inner wall surface 4d of side portion 4b of support body 4. By forming metal layer 20 in this way, the heat from chuck top 2 is reflected by metal layer 20 so that the amount of heat transfer from chuck top 2 to support body 4 may be reduced. It is noted that in FIG. 2, reflection plate 10 provided inside cavity portion 5 is not shown for convenience of illustration.

Here, the material of metal layer 20 is not specifically limited. For example, nickel, aluminium, silver, stainless steel or the like may be used. Here, it is necessary that the reflectivity of metal layer 20 is higher than that of support body 4. When the reflectivity of metal layer 20 is higher than that of support body 4, the amount of heat absorbed by support body 4 can be reduced, so that the temperature rise of support body 4 may be reduced.

The method of forming metal layer 20 is also not specifically limited. For example, metal layer 20 may be formed by providing a metal foil on the inner wall surface of cavity portion 5, or metal layer 20 may be formed by thermal spraying or plating. Alternatively, metal layer 20 may be formed by combining these methods. For example, aluminium may be thermally sprayed on the inner wall surface of cavity portion 5, followed by plating of nickel or the like.

Figure 3:
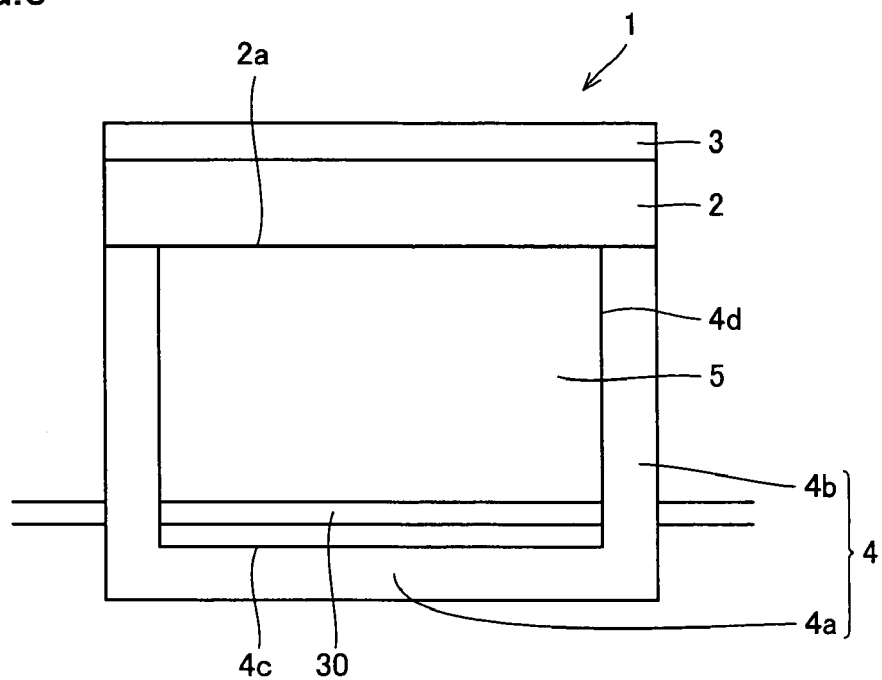
FIG. 3 is a schematic cross sectional view of another example of a wafer holding body in accordance with the present invention.

FIG. 3 shows a schematic cross sectional view of another exemplary wafer holding body in accordance with the present invention. Here, a cooling pipe 30 is provided in cavity portion 5. Cooling pipe 30 is installed in such a manner as to pass through cavity portion 5 from the outside of wafer holding body 1. Then, the inside of cooling pipe 30 serves as a channel so that a cooling gas or liquid is fed into the channel. Thus, the amount of heat transfer from chuck top 2 to base portion 4a of support body 4 can be reduced. Therefore, the temperature rise of base portion 4a of support body 4 can be suppressed effectively.

Figure 4:
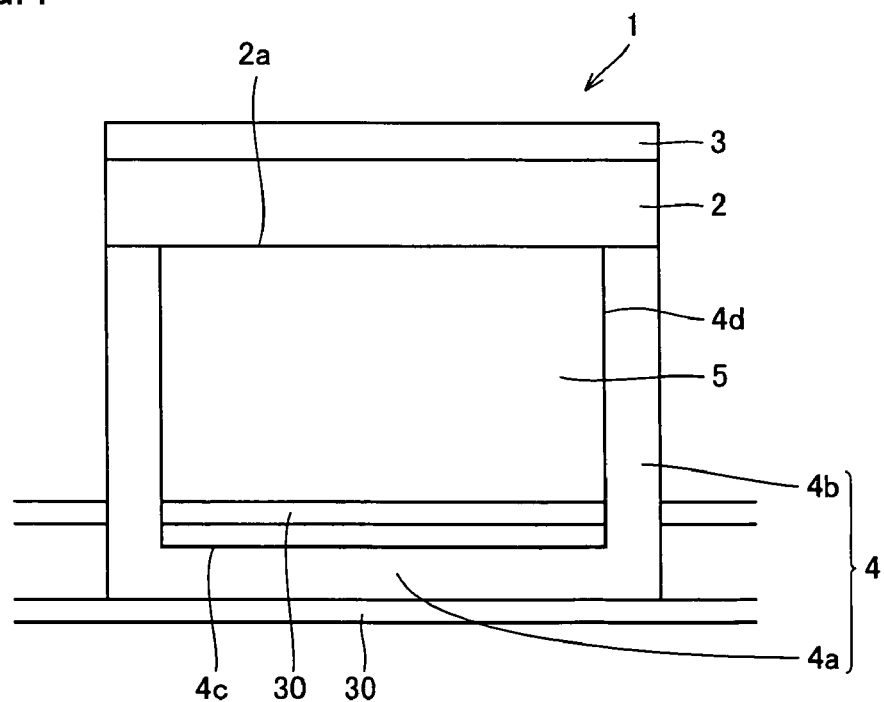
FIG. 4 is a schematic cross sectional view of another example of a wafer holding body in accordance with the present invention.

FIG. 4 shows a schematic cross sectional view of another exemplary wafer holding body in accordance with the present invention. Here, cooling pipe 30 is provided in cavity portion 5, and cooling pipe 30 is additionally provided on the back surface of base portion 4a of support body 4 (the surface of base portion 4a that is opposite to surface 4c of base portion 4a). In this case, a cooling gas or liquid is fed into each of cooling pipe 30 in cavity portion 5 and cooling pipe 30 on the back surface of base portion 4a of support body 4, whereby the temperature rise of base portion 4a of support body 4 can be suppressed more efficiently.

It is noted that in FIGS. 3 and 4, reflection plate 10 installed in cavity portion 5 is not shown for convenience of illustration.

Here, one or more cooling pipes 30 can be installed. For example, when a plurality of cooling pipes 30 are installed, it is preferable that cooling pipes 30 are installed in contact with base portion 4a of support body 4 as much as possible, and cooling pipes 30 are installed such that the distance between cooling pipes 30 is minimized. Therefore, the cross sectional shape of cooling pipe 30 may be triangular or quadrangular, so that the contact area between cooling pipe 30 and the undersurface of support body 4 can be increased, and in addition, the distance between cooling pipes 30 can be minimized.

Cooling pipe 30 may be fixed to base portion 4a of support body 4. For example, cooling pipe 30 is fixed to base portion 4a of the support body by screwing using a metal band or the like, so that cooling pipe 30 and base portion 4a of support body 4 can mechanically be fixed to each other. Alternatively, cooling pipe 30 may be adhered to base portion 4a of support body 4 using a solder material so that cooling pipe 30 and base portion 4a of support body 4 can be fixed to each other.

Furthermore, a plate-like body may be inserted between cooling pipe 30 and base portion 4a of support body 4. When a plate-like body is inserted between cooling pipe 30 and base portion 4a of support body 4 in this way, the contact area between cooling pipe 30 and base portion 4a of support body 4 can be increased with the plate-like body interposed therebetween, so that the temperature rise of base portion 4a of support body 4 can be suppressed efficiently by cooling base portion 4a of support body 4.

In the foregoing description, cooling pipe 30 and the plate-like body are preferably joined to each other using a mechanical technique, welding, or a solder material, in terms of effective cooling of base portion 4a of support body 4. The method of joining cooling pipe 30 and the plate-like body is not specifically limited. For example, cooling pipe 30 and the plate-like body may be joined to each other by installing and fixing cooling pipe 30 on the plate-like body by screwing using a metal band or the like.

When the plate-like body and cooling pipe 30 are joined to each other, the contact face of the plate-like body with cooling pipe 30 may be spot-faced in a shape close to the cross sectional shape of cooling pipe 30 thereby increasing the contact area between the plate-like body and cooling pipe 30. Therefore, the temperature rise of base portion 4a of support body 4 can be suppressed efficiently.

In addition, a thermally conductive heat transfer material having deformability may be installed and joined between the plate-like body and cooling pipe 30 in order to improve the cooling efficiency. Here, the material of the heat transfer material is not specifically limited. Preferably, a heat-resistant resin such as silicone resin, epoxy resin or phenol resin is used. In order to improve the heat conductivity, a filler made of ceramic or an inorganic material may be added to these resins.

Although cooling gas or liquid is fed into cooling pipe 30 in the foregoing description, for example, the following cooling means may be used as another cooling means. First, two plate-like bodies are prepared. After a groove is formed in at least one of the two plate-like bodies, these plate-like bodies are joined to each other. Then, a part of the joined plate-like bodies is installed inside cavity portion 5, and cooling fluid is fed into the groove, which is a channel formed in the joined plate-like bodies, thereby cooling base portion 4a of support body 4. Here, two plate-like bodies may be joined by welding or a solder material or may be joined by a mechanical technique such as screwing. The joining technique can be determined as appropriate depending on the kind of fed fluid.

As another cooling means, a groove may be formed at surface 4c of base portion 4a of support body 4 and then covered with a plate-like body to form a channel into which cooling fluid is fed. In this case, a groove may be formed not at support body 4 but at a plate-like body on surface 4c of support body 4. Alternatively, grooves may be formed at both of support body 4 and a plate-like body.

It is noted that cooling gas or liquid fed in the channel as described above is not specifically limited as long as it does not cause corrosion in the channel. For example, the cooling gas may include air, nitrogen, argon, helium, or the like. Although the use of water as cooling liquid is suitable in terms of heat capacity, leakage from the channel would give considerable impact on other units. Therefore, a solvent such as Galden may be used. Since a solvent such as Galden can be used at a temperature of 0° C. or lower, it can provide relatively efficient cooling in spite of small heat capacity.

The flow rate of the fluid is also not specifically limited. In terms of efficient cooling, a flow rate of 1 liter/minute or more is preferable. The upper limit of the flow rate is also not specifically limited. Preferably, the flow rate of the fluid is 300 liters/minute or less. If the flow rate of the fluid exceeds 300 liters/minute, the pressure exerted on the joint of the channel arrangement is increased, so that damage at that part or leakage of the fluid from that part is more likely to occur. In this way, the kind and the flow rate of the fluid can be selected as appropriate depending on a purpose.

Furthermore, the cross sectional area of the channel is not specifically limited. In terms of improvement of cooling efficiency, the cross sectional area of the channel is preferably small to some extent. For example, if the cross section of the channel is circular, the inner diameter of the cross section of the channel is preferably at least 2 mm and at most 10 mm. If the inner diameter of the cross section of the channel is less than 2 mm, the pressure loss in feeding a fluid is likely to be increased. If the inner diameter of the cross section of the channel exceeds 10 mm, efficient cooling may become difficult.

In the foregoing description, the material of cooling pipe 30 and the plate-like body as a channel is not specifically limited. Considering processibility, a metal is preferably used. The metal used for cooling pipe 30 and/or a plate-like body may include, for example, a metal such as stainless steel, copper, aluminium, or nickel, or an alloy thereof In addition, cooling pipe 30 and/or a plate-like body may be improved in resistance to corrosion by plating the above-noted metal with nickel, gold or the like.

Among others, a metal used for cooling pipe 30 and/or the plate-like body may preferably be copper or aluminium having high thermal conductivity in terms of improvement of cooling efficiency. Cooling pipe 30 and/or the plate-like body made of copper or aluminium has high thermal conductivity so that it is likely to remove heat efficiently using a fluid.

As another cooling means, a cooling fluid may be fed between support body 4 and chuck top 2. In this cooling means, for example, cooling pipe 30 is inserted between support body 4 and chuck top 2, and a cooling gas such as air is jetted from cooling pipe 30. Here, a cooling gas may be jetted, for example, only from the end portion of cooling pipe 30 or may be jetted from a hole formed on the surface of cooling pipe 30 with the end portion of cooling pipe 30 being closed. The number of cooling pipes 30 is not limited to one and may be more than one.

Figure 11:
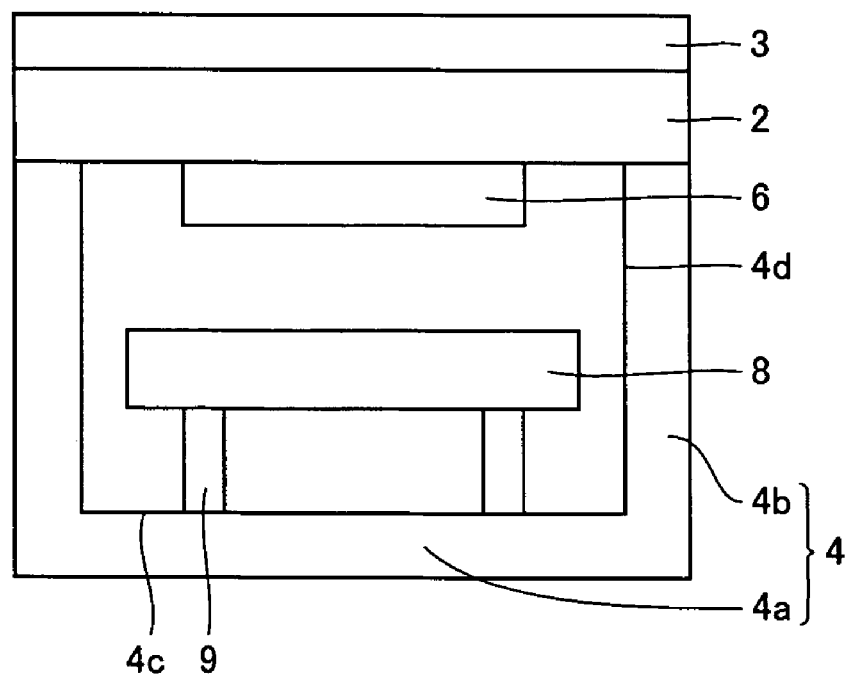
FIG. 11 is a schematic cross sectional view of another example of a wafer holding body in accordance with the present invention.

FIG. 11 shows a schematic cross sectional view of another exemplary wafer holding body in accordance with the present invention. This wafer holding body 1 is characterized in that a movable cooling mechanism is used as cooling means, where cooling portion 8 is attached to an elevator portion 9 attached to base portion 4a of support body 4, and elevator portion 9 allows cooling portion 8 to move up and down. In the use of this cooling means, while chuck top 2 is heated by heater body 6, cooling portion 8 is positioned on the side of base portion 4a of support body 4, so that support body 4 can be cooled efficiently. Then, when it becomes necessary to decrease the temperature of chuck top 2, cooling portion 8 is elevated to be brought into contact with chuck top 2, thereby cooling chuck top 2 efficiently. It is noted that, for example, elevator means such as an air cylinder may be used as elevator portion 9. In this manner, the cooling speed of chuck top 2 can significantly be improved, and throughput can significantly be improved. It is noted that reflection plate 10 installed inside cavity portion 5 is not shown also in FIG. 11 for convenience of illustration.

Alternatively, cooling portion 8 may be fixed to surface 4c of base portion 4a of support body 4. Here, the method of fixing cooling portion 8 may include, for example, screwing or use of heat-resistant adhesive.

The material of cooling portion 8 is not specifically limited. For example, aluminum or copper having relatively high thermal conductivity or an alloy thereof may be used. Alternatively, for example, stainless steel, magnesium alloy, nickel, or any other metal may be used as a material of cooling portion 8. A metal film having oxidation resistance such as nickel, gold or silver may be formed on the surface of cooling portion 8 by thermal spraying, plating or the like.

Alternatively, the material of cooling portion 8 may be, for example, ceramic such as aluminium nitride or silicon carbide having relatively high thermal conductivity. Alternatively, the material of cooling portion 8 may be, for example, silicon nitride or aluminium oxynitride having high mechanical strength and high durability. Alternatively, the material of cooling portion 8 may be, for example, ceramic oxide such as alumina, cordierite or steatite, which are relatively cheap.

As described above, a variety of materials may be used for cooling portion 8. However, among others, aluminium or copper with nickel plating is particularly preferable because of high oxidation resistance, high thermal conductivity and relatively low costs.

Heat transfer to cooling portion 8 can be removed from cooling portion 8 quickly by feeding a cooling fluid as described above to the inside of cooling portion 8.

A suitable example of cooling portion 8 is as follows. First, two aluminium plates are prepared. A groove is provided in one of the aluminium plates to form a channel. Then, the entire surface of the aluminium plate provided with a groove is nickel plated thereby improving corrosion resistance and oxidation resistance. Then, the nickel plated aluminium plate is bonded to the entire surface of the other aluminium plate. Then, for example, an O-ring is inserted in order to prevent leakage of fluid to the surrounding of the channel, and the two aluminium plates are joined to each other by screwing or welding, resulting in cooling portion 8.

Another suitable example of cooling portion 8 is as follows. First, two copper (oxygen-free copper) plates are prepared, and a groove is provided in one of the copper plates to form a channel. Then, this copper plate, the other copper plate and a stainless steel pipe serving as an. inlet/outlet port for fluid are joined to each other by soldering, and the entire surface thereof is nickel plated, resulting in cooling portion 8.

As another suitable example of cooling portion 8, a cooling pipe in which a cooling fluid flows is attached to a metal plate such as an aluminum plate or copper plate. In this case, the metal plate such as an aluminium plate or copper plate is spot-faced in a shape close to the cross sectional shape of the cooling pipe and the cooling pipe is brought into intimate contact with the spot-faced portion, thereby improving the cooling efficiency of cooling portion 8. In addition, in order to improve the intimate contact between the cooling pipe and the metal plate, thermally conductive resin, ceramic or the like may be inserted therebetween as an interposing layer.

In wafer holding body 1 in accordance with the present invention, reflection plate 10 in cavity portion 5, metal layer 30 formed at the inner wall surface of cavity portion 5, and the cooling means as described above are combined. Thus, even when a semiconductor wafer placed on the top of wafer holding body 1 is heated, the effect of preventing the temperature rise of base portion 4a of support body 4 can be further improved.

In addition, wafer holding body 1 in accordance with the present invention preferably has heater body 6 as shown in FIG. 1. This is because in probing of semiconductor wafers in recent years, semiconductor wafers are often heated to a temperature of 100° C.-200° C.

Therefore, if the heat transfer from heater body 6 heating chuck top 2 to support body 4 cannot be prevented, heat is transferred to a driving system below support body 4. Then, the difference in thermal expansion between the metal parts of the driving system causes deviations in accuracy, which may result in significant reduction in flatness and parallelism of the wafer-placing surface (the surface of chuck top conductive layer 3) of wafer holding body 1.

However, in wafer holding body 1 in accordance with the present invention, heat of chuck top 2 is less likely to be transferred to base portion 4a of support body 4, so that the flatness and parallelism of the wafer-placing surface of wafer holding body 1 are less likely to be significantly reduced. In addition, wafer holding body 1 in accordance with the present invention uses hollow support body 4 having cavity portion 5, so that weight reduction can be achieved as compared with when a solid, cylinder-shaped support is used.

Figure 5:
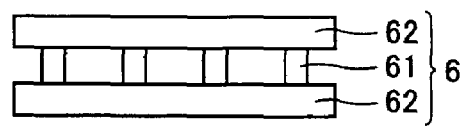
FIG. 5 is a schematic cross sectional view of an exemplary heater body for use in the present invention.

FIG. 5 shows a schematic cross sectional view of an exemplary heater body for use in the present invention. Here, heater body 6 is configured such that a resistance heating element 61 is sandwiched between insulators 62. For example, a metal foil made of a metal such as nickel, stainless steel, silver, tungsten, molybdenum, or chrome, or an alloy including at least two kinds of them can be used as resistance heating element 61.

Specifically, stainless steel or nichrome is preferably used as a metal used for resistance heating element 61. When processed into the shape of a heating element, stainless steel and nichrome are likely to form a resistance heating element circuit pattern relatively precisely by etching or any other technique. In addition, stainless steel and nichrome are cheap and oxidation resistant, so that they can endure prolonged use even when used at a high temperature.

Moreover, insulator 62 is not specifically limited as long as it is heat-resistant. For example, mica, silicone resin, epoxy resin, phenol resin, or the like may be used.

It is noted that heater body 6 can be fixed to the portion where heater body 6 is provided by a mechanical method, for example, such as screwing.

Preferably, Young's modulus of support body 4 as described above is 200 GPa or more. If Young's modulus of support body 4 is less than 200 GPa, the thickness of base portion 4a of support body 4 cannot be reduced and thus the volume of cavity portion 5 cannot be secured enough. Therefore, the heat-insulation effect by cavity portion 5 cannot be achieved enough. In addition, if Young's modulus of support body 4 is less than 200 GPa, the space in which cooling means is installed in cavity portion 5 may not be reserved. More preferably, Young's modulus of support body 4 is 300 GPa or more. In particular, when a material having Young's modulus of 300 GPa or more is used for support body 4, deformation of support body 4 is considerably reduced, so that further miniaturization and weight reduction of support body 4 are preferably achieved.

Preferably, the thermal conductivity of support body 4 is 40 W/mK or less. If the thermal conductivity of support body 4 exceeds 40 W/mK, the heat applied to chuck top 2 is easily transferred to support body 4, which may affect the accuracy of the driving system. Recently, it is requested that a semiconductor wafer should be heated at a high temperature of 150° C.-200° C. in probing. Therefore, in order to prevent heat transmission to the driving system, the thermal conductivity of support body 4 is more preferably 10 W/mK or less. More preferably, the thermal conductivity of support body 4 is 5 W/mK or less. When the thermal conductivity of support body 4 is 5 W/mK or less, the amount of heat transmission from support body 4 to the driving system may be significantly reduced.

As a material of support body 4 to satisfy the conditions of thermal conductivity as described above, mullite, alumina, or a composite of mullite and alumina (mullite-alumina composite) is preferably used. Mullite is preferable in that the thermal conductivity is small and the heat-insulation effect is high. Alumina is preferable in that Young's modulus is large and the rigidity is high. Mullite-alumina composite is generally preferable in that the thermal conductivity is smaller than that of alumina and Young's modulus is larger than that of mullite.

Preferably, the thickness of side portion 4b of support body 4 is 20 mm or less. If the thickness of side portion 4b of support body 4 exceeds 20 mm, the amount of heat transmission from chuck top 2 to support body 4 may be increased. In order to reduce the amount of heat transmission from chuck top 2 to support body 4, the thickness of side portion 4b of support body 4 that supports chuck top 2 is at least 10 mm and at most 15 mm. In addition, the thickness of that portion of side portion 4b of support body 4 which is in contact with chuck top 2 is preferably at least 2 mm and at most 5 mm. When this thickness is at least 2 mm and at most 5 mm, the balance of support body 4 between strength and heat insulation is likely to be improved.

Preferably, the height of side portion 4b of support body 4 (the height excluding the thickness of base portion 4a of support body 4) is 10 mm or more. If the height of side portion 4b of support body 4 is less than 10 mm, the pressure from the probe card is applied to chuck top 2 and additionally transferred to support body 4 during probing. Therefore, base portion 4a of support body 4 may become bent thereby possibly deteriorating the flatness of the wafer-placing surface.

Preferably, the thickness of base portion 4a of support body 4 is at least 10 mm and at most 35 mm. If the thickness of base portion 4a of support body 4 is less than 10 mm, in addition to the aforementioned problem, heat of chuck top 2 is easily transferred to base portion 4a of support body 4, which may cause support body 4 to be warped due to thermal expansion thereby possibly deteriorating the flatness and parallelism of the wafer-placing surface. On the other hand, if the thickness of base portion 4a of support body 4 is 35 mm or less, suitably, wafer holding body 1 of the present invention can be miniaturized.

Preferably, a heat insulating structure is provided at the supporting surface of support body 4 which supports chuck top 2 (the contact surface of side portion 4b of support body 4 with chuck top 2). Here, the heat insulating structure may be fabricated, for example, by partially notching the supporting surface of support body 4 to form a groove. This groove reduces the contact area between chuck top 2 and support body 4, resulting in a heat insulating structure.

Preferably, when a groove is formed at the supporting surface of support body 4, Young's modulus of chuck top 2 is 250 GPa or more. In probing, the pressure of the probe card is applied to chuck top 2, and therefore the amount of deformation of chuck top 2 made of a material having small Young's modulus is increased if a groove is present in the supporting surface of support body 4. Then, the increased amount of deformation of chuck top 2 may lead to damage to a semiconductor wafer and damage to chuck top 2

Figure 6:
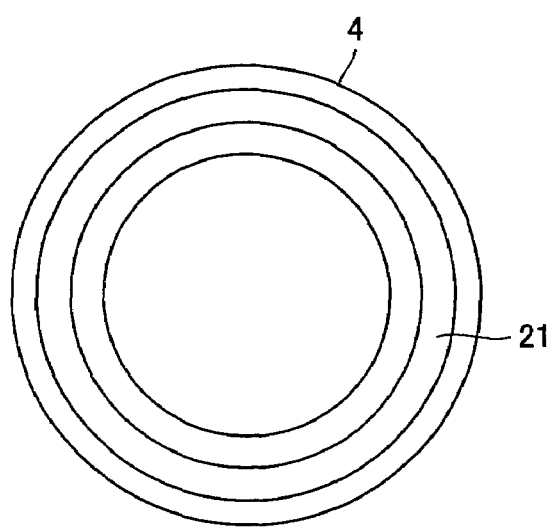
FIG. 6 is a schematic plan view showing another example of a heat-insulating structure of a wafer holding body in accordance with the present invention.
Figure 7:
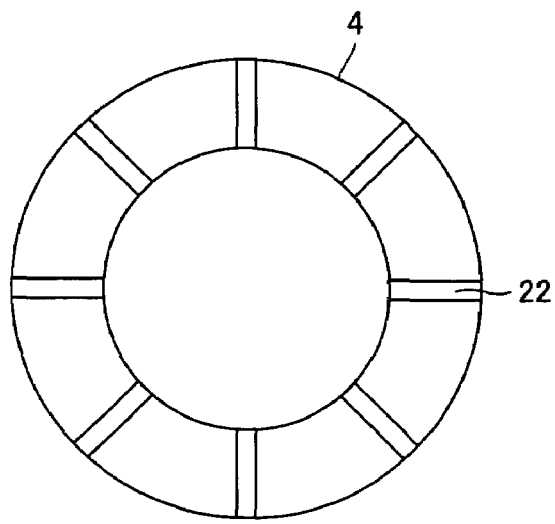
FIG. 7 is a schematic plan view showing another example of a heat-insulating structure of a wafer holding body in accordance with the present invention.

Furthermore, the groove formed at the supporting surface of support body 4 may include, for example, a concentrically-arranged groove 21 as shown in FIG. 6, a radially-arranged groove 22 as shown in FIG. 7, a groove provided with a number of protrusions, a groove shaped like a rectangle, or the like. The shape of the groove is not specifically limited but preferably symmetric. If the shape of the groove is not symmetric, the pressure applied to chuck top 2 cannot be distributed uniformly, which may have an effect of deformation or damage of chuck top 2.

Figure 8:
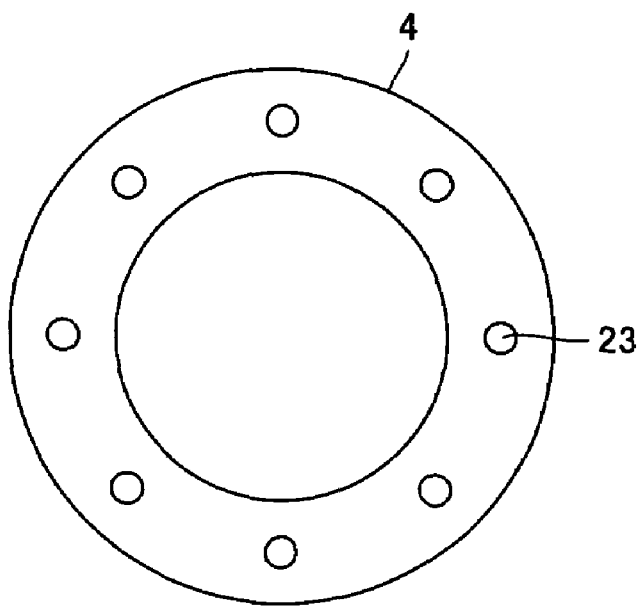
FIG. 8 is a schematic plan view showing another example of a heat-insulating structure of a wafer holding body in accordance with the present invention.

In addition, as the heat insulating structure provided at the supporting surface of support body 4 which supports chuck top 2, for example, as shown in FIG. 8, a plurality of cylindrical pillar-like members 23 can be installed on the supporting surface of support body 4. Here, pillar-like members 23 are preferably arranged evenly in a concentric manner or any manner similar thereto. The number of pillar-like members 23 is eight or more. Recently, the size of a semiconductor wafer is increased such as 8 to 12 inches. Therefore, if pillar-like members 23 are less than eight, the distance between pillar-like members 23 is increased so that chuck top 2 may be bent between pillar-like members 23 when a probe pin of a probe card is pressed against a semiconductor wafer placed on chuck top 2. In addition, since two interfaces are formed, that is, the interface between chuck top 2 and pillar-like member 23 and the interface between pillar-like member 23 and support body 4, these interfaces serve as thermal-resistance layers. Thus, the thermal-resistance layer can be doubled, so that heat generated at chuck top 2 to be transmitted to support body 4 can effectively be insulated.

Here, the material used for pillar-like member 23 includes, for example, silicon nitride, mullite, a mullite-alumina composite, steatite, cordierite, stainless steel, glass, heat-resistant resin such as polyimide, epoxy, or phenol, or a composite thereof.

Preferably, the material of pillar-like member 23 has a thermal conductivity of 30 W/mK or less. If the thermal conductivity of the material of pillar-like member 23 exceeds 30 W/mK, the effect of preventing heat transmission from chuck top 2 to support body 4 may be reduced.

Preferably, a metal layer is also formed on the outer surface of support body 4. Since an electric field or electromagnetic wave produced from the heater body for heating chuck top 2, the driving system or peripheral equipment may become noise during probing, the formation of a metal layer on the outer surface of support body 4 may block this noise. It is noted that a method of forming a metal layer is not specifically limited. For example, a conductive paste of metal powder such as silver, gold, nickel, or copper with addition of glass frit may be applied by a brush and baked.

Alternatively, the metal layer on the outer surface of support body 4 may be formed by thermally spraying a metal such as aluminium or nickel. Alternatively, the metal layer on the outer surface of support body 4 may be formed by plating the outer surface of support body 4 with a metal. Alternatively, the metal layer may be formed on the outer surface of support body 4 by combining these methods. Among others, the metal layer on the outer surface of support body 4 is preferably formed by plating or thermal spraying of a metal. Since plating provides a high adhesive strength, the reliability of the metal layer on the outer surface of support body 4 may be higher. On the other hand, spraying may allow the metal layer to be formed on the outer surface of support body 4 at relatively low costs.

Figure 9:
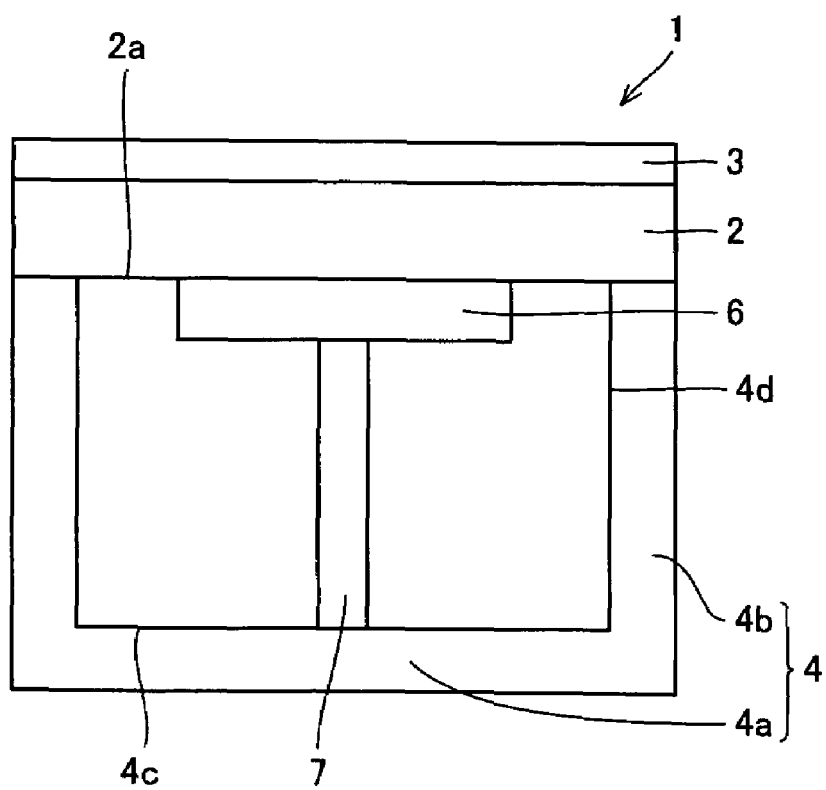
FIG. 9 is a schematic cross sectional view of another example of a wafer holding body in accordance with the present invention.

FIG. 9 shows a schematic cross sectional view of another example of a wafer holding body in accordance with the present invention. Here, wafer holding body 1 in accordance with the present invention is characterized in that a support rod 7 is provided in the vicinity of the central portion of cavity portion 5 inside support body 4, and heater body 6 is provided at the tip end portion of support rod 7. Because of such a configuration, when a probe card is pressed against chuck top 2 during probing, support rod 7 prevents deformation of chuck top 2. It is noted that reflection plate 10 installed inside cavity portion 5 is not shown also in FIG. 9 for convenience of illustration.

The material of support rod 7 is preferably the same as the material of support body 4. Both support body 4 and support rod 7 thermally expand because they receive heat from heater body 6 that heats chuck top 2. Here, if the material of support body 4 is different from that of support rod 7, the difference of the thermal expansion coefficient causes unevenness between support body 4 and support rod 7, so that chuck top 2 is more likely to be deformed.

The size of support rod 7 is not specifically limited. However, the cross sectional area of support rod 7 is preferably 0.1 cm$^2$ or more. If the cross sectional area of support rod 7 is less than 0.1 cm$^2$, the supporting effect is not enough and support rod 7 is more likely to be deformed. Furthermore, the cross sectional area of support rod 7 is preferably 100 cm$^2$ or less. If the cross sectional area of support rod 7 exceeds 100 cm$^2$, the heat from chuck top 2 is easily transferred to base portion 4a of support body 4, so that the temperature of base portion 4a of support body 4 is more likely to be increased.

The shape of support rod 7 is not specifically limited. For example, a cylindrical shape, a triangular prism shape, a quadrangular prism shape, a pipe shape, or the like may be employed. The method of fixing support rod 7 to support body 4 is also not specifically limited and includes soldering using an active metal solder material, glass sealing, screwing, or the like. Among these, screwing is particularly preferable. The screwing facilitates attachment/removal of support rod 7 to/from support body 4 and in addition eliminates the need for thermal treatment in fixing, thereby preventing thermal deformation of support body 4 and support rod 7.

Preferably, an electromagnetic shielding electrode layer made of a metal layer is also formed between heater body 6 and chuck top 2 to block (shield) an electromagnetic wave. This electromagnetic shielding electrode layer serves to block noise caused by an electromagnetic wave or an electric field produced in heater body 6 or the like, which may affect probing of a semiconductor wafer. This electromagnetic shielding electrode layer may be formed, for example, by inserting a metal foil between heater body 6 and chuck top 2. The material of the metal foil is not specifically limited. Since the temperature of heater body 6 becomes approximately 200° C., stainless steel, nickel, aluminium, or the like is preferably used.

Figure 10:
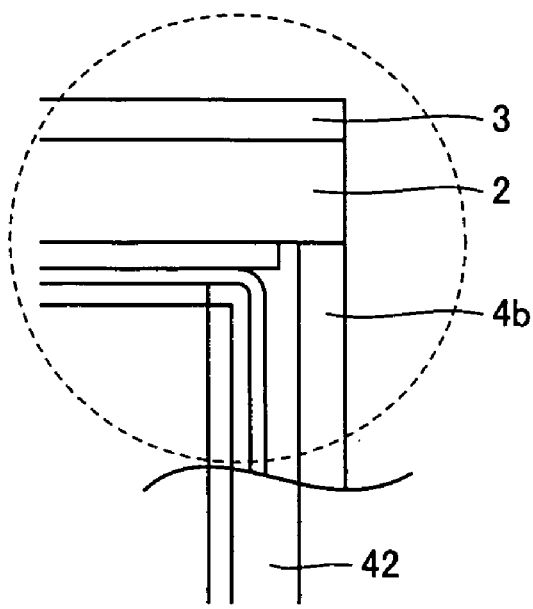
FIG. 10 is a schematic enlarged cross sectional view of a part of the wafer holding body shown in FIG. 9.

FIG. 10 shows a schematic enlarged cross sectional view of a part of the wafer holding body shown in FIG. 9. As shown in FIG. 10, side portion 4b of support body 4 of the wafer holding body in accordance with the present invention is preferably provided with a through hole 42 through which a heater electrode for supplying power to heater body 6 or an electromagnetic shielding electrode layer is inserted. Here, in particular, through hole 42 is preferably formed in the vicinity of the central portion of side portion 4b of support body 4. If through hole 42 is formed close to the outer circumferential portion of side portion 4b, the strength of support body 4 which is provided by side portion 4b of support body 4 is reduced due to the effect of the pressure of the probe card, so that support body 4 may be deformed in proximity to through hole 42. It is noted that the electrode and the through hole are not shown in the figures other than FIG. 10.

If the amount of warping of the wafer-placing surface (here, the surface of chuck top conducive layer 3) is greater than 30 μm, the probe pin of a probe card is in improper contact during probing, so that the electric characteristics of a semiconductor wafer cannot be evaluated or a failure determination is made due to poor contact. Undesirably, semiconductor chips are thus evaluated unduly poorly, thereby possibly reducing yields.

It is not preferable that the parallelism between the wafer-placing surface and the back surface of base portion 4a of support body 4 are greater than 30 μm, because poor contact may take place similarly. Even if the amount of warping of the wafer-placing surface and the parallelism between the wafer-placing surface and the undersurface of support body 4 are as good as 30 μm or less at room temperature, it is not preferable if the amount of warping of the wafer-placing surface and the parallelism of the wafer-placing surface are greater than 30 μm during probing of a semiconductor wafer heated at 200° C. The same applies to probing of a semiconductor wafer at −70° C. In other words, it is preferable that both of the amount of warping of the wafer-placing surface and the parallelism between the wafer-placing surface and the undersurface of support body 4 are 30 μm or less throughout the temperature range for probing (for example, −70° C. to 200° C.)

Chuck top conductive layer 3 is formed on the surface of chuck top 2. Chuck top conductive layer 3 is formed to serve to protect chuck top 2 from corrosive gas, acid or alkaline chemicals, organic solvent or water that are usually used in manufacturing a semiconductor chip and to serve to establish a ground in-between from a semiconductor wafer placed on chuck top 2 in order to block noise from below chuck top 2.

The method of forming chuck top conductive layer 3 is not specifically limited and may include applying a conductive paste by screen printing followed by baking, vapor deposition or sputtering, thermal spraying or plating, or the like.

Among others, thermal spraying or plating is preferably used to form chuck top conductive layer 3. Such a method does not involve a heat treatment in forming chuck top conductive layer 3 and thus does not cause warp in chuck top 2, which would be caused by heat treatment. In addition, because of relatively low costs, chuck top conductive layer 3 can be formed inexpensively with excellent characteristics.

In particular, chuck top conductive layer 3 is preferably fabricated by forming a thermal sprayed film on chuck top 2 by thermal spraying and forming a plating film on the thermal sprayed film by plating. The thermal sprayed film formed by thermal spraying is superior to a plating film formed by plating in adhesiveness of ceramic or a metal-ceramic composite. This is because the sprayed material, for example, aluminium, nickel or the like produces some amount of oxide, nitride or oxynitride during thermal spraying, and the produced compound reacts with the surface of chuck top 2 and strongly adheres thereto.

However, since the thermal sprayed film includes these compounds, the conductivity of the thermal sprayed film becomes low. By contrast, the plating film can form almost pure metal, so that chuck top conductive layer 3 with excellent conductivity can be formed although the adhesive strength with chuck top 2 is not so high as a thermal sprayed film. Therefore, when a thermal sprayed film is underlaid and a plating film is formed thereon, the plating film has good adhesive strength with the thermal sprayed film, which is a metal, and also provides good electric conductivity.

Preferably, surface roughness Ra of chuck top conductive layer 3 on chuck top 2 is 0.1 μm or less. If surface roughness Ra exceeds 0.1 μm, in determination of the electric characteristics of a semiconductor wafer generating a large amount of heat, the heat generated by self-heating of the semiconductor wafer itself cannot be dissipated from chuck top 2 during probing, thereby increasing the temperature of the semiconductor wafer and possibly resulting in thermal breakdown. It is noted that surface roughness Ra of chuck top conductive layer 3 of 0.02 μm or less is preferable in that heat can be dissipated more efficiently.

When the heating element installed at chuck top 2 is heated to probe a semiconductor wafer, for example, at 200° C., the temperature of the back surface of base portion 4a of support body 4 is preferably 100° C. or lower. If the temperature of the back surface of base portion 4a of support body 4 exceeds 100° C., the driving system below support body 4 is distorted due to the thermal expansion coefficient difference and is thus degraded in accuracy, thereby causing inconvenience such as misalignment in probing, warping of a semiconductor wafer, or improper contact of a probe pin due to the reduced parallelism. Accordingly, a semiconductor wafer cannot be tested accurately. In addition, when the characteristics of a semiconductor wafer are determined with the temperature thereof increased to 200° C., followed by determination at room temperature, it takes much time to cool the semiconductor wafer from 200° C. to room temperature, thereby degrading throughput.

Preferably, Young's modulus of chuck top 2 is 250 GPa or more. If Young's modulus of chuck top 2 is less than 250 GPa, the load applied to chuck top 2 during probing causes bending of chuck top 2, thereby significantly deteriorating the flatness and parallelism of the wafer-placing surface. Therefore, in view of the forgoing situations, Young's modulus of chuck top 2 is preferably 250 GPa or more, more preferably 300 GPa or more.

Preferably, the thermal conductivity of chuck top 2 is 15 W/mK or more. If the thermal conductivity of chuck top 2 is less than 15 W/mK, the uniformity of temperature distribution of a semiconductor wafer placed on chuck top 2 may become worse. Therefore, if the thermal conductivity of chuck top 2 is 15 W/mK or more, such thermal uniformity can be obtained that is acceptable to probing. The material of chuck top 2 having such thermal conductivity may include, for example, alumina at a purity of 99.5% (thermal conductivity 30 W/mK).

Preferably, the thermal conductivity of chuck top 2 is 170 W/mK or more. The material of chuck top 2 having such thermal conductivity may include, for example, aluminium nitride (170 W/mK), a composite of silicon and silicon carbide (170 W/mK to 220 W/mK), or the like. If the thermal conductivity of chuck top 2 is 170 W/mK or more, chuck top 2 can be excellent in thermal uniformity.

Preferably, the thickness of chuck top 2 is 8 mm or more. If the thickness of chuck top 2 is less than 8 mm, the load applied to chuck top 2 during probing causes bending of chuck top 2, thereby significantly deteriorating the flatness and parallelism of the wafer-placing surface. Thus, because of the poor contact of the probe pin, the electric characteristics of a semiconductor wafer may not be inspected accurately and in addition, a semiconductor wafer may be broken. In view of the forgoing situations, the thickness of chuck top 2 is preferably 8 mm or more, more preferably 10 mm or more.

As a material of chuck top 2, for example, a metal-ceramic composite, ceramic or metal can be used. Here, preferably used as a metal-ceramic composite is a composite of aluminium and silicon carbide, a composite of silicon and silicon carbide or a composite of aluminium, silicon and silicon carbide, which have relatively high thermal conductivity and provide thermal uniformity when a semiconductor wafer is heated. In particular, a composite of silicon and silicon carbide has especially high Young's modulus and has high thermal conductivity, so that it is particularly preferable to use a composite of silicon and silicon carbide as a material of chuck top 2.

Furthermore, since these composites are conductive, the heating element can be formed, for example, by forming an insulating layer on the surface opposite to the wafer-placing surface of chuck top 2 by thermal spraying or screen printing and screen-printing a conductive layer on the insulating layer or forming a conductive layer in a prescribed pattern by vapor deposition or the like.

Alternatively, the heating element can also be formed by forming a metal foil made of stainless steel, nickel, silver, molybdenum, tungsten, chrome, or an alloy thereof in a prescribed heating element pattern by etching. In this method, the heating element can be insulated from chuck top 2 by forming an insulating layer as described above. Alternatively, for example, an insulative sheet may be inserted between chuck top 2 and the heating element. In this case, preferably, an insulating layer can be formed remarkably cheaply and easily as compared with the above-noted method. The insulative sheet for use in this case includes a mica sheet or a resin sheet such as epoxy resin, polyimide resin, phenol resin or silicone resin in view of heat resistance. Among those, especially a mica sheet is preferably used. The reason is that a mica sheet is excellent in heat resistance and electric insulation, easily processed, and moreover cheap.

Ceramic as a material of chuck top 2 is relatively usable since it does not require formation of an insulating layer as described above. In this case, the method of forming a heating element can be selected from the techniques as described above. Among the materials of ceramic used as a material of chuck top 2, alumina, aluminium nitride, silicon nitride, mullite, or an alumina and mullite composite is preferable. These materials are particularly preferable since they have relatively high Young's modulus, thereby reducing deformation of chuck top 2 caused by pressing by a probe card.

Among them, alumina is most excellent as a material of chuck top 2 because of relatively low costs and excellent electric characteristics at high temperature. In view of increasing insulation property at high temperature, the purity of alumina is preferably 99.6% or more, more preferably 99.9% or more. More specifically, silicon oxide, alkaline-earth metal oxide, or the like is added to alumina in order to reduce the sintering temperature during sintering. This degrades the electric characteristics of pure alumina, such as electrical insulation at high temperature. Therefore, the purity of alumina is preferably 99.6% or more, more preferably 99.9% or more.

The amount of warping of chuck top 2 is preferably 30 μm or less when a load of 3.1 MPa is applied to chuck top 2. In probing, a number of probe pins for inspecting the electric characteristics of a semiconductor wafer are pressed against a semiconductor wafer from a probe card, so that that pressure may affect chuck top 2 causing some warping of chuck top 2. Here, if the amount of warping of the chuck top 2 exceeds 30 μm, the probe pin of the probe card cannot be pressed against the semiconductor wafer uniformly, so that it may become impossible to inspect the electric characteristics of the semiconductor wafer. More preferably, the amount of warping of chuck top 2 is 10 μm or less when a load of 3.1 MPa is applied to chuck top 2.

Wafer holding body 1 in accordance with the present invention can be used for a heater unit for heating a process target such as a semiconductor wafer. This heater unit may be used for a wafer prober for testing a semiconductor wafer. Wafer holding body 1 in accordance with the present invention is suitably applied to a wafer prober, handler, or tester to make the most of the characteristics of wafer holding body 1 of the present invention with high rigidity and high thermal conductivity.

(Experiment 1)

A chuck top having a diameter of 310 mm and a thickness of 15 mm and made of Si-SiC composite was prepared. Then, a concentrically arranged groove and a through hole were formed on one surface of the chuck top for vacuum chucking of a semiconductor wafer. Then, that surface was nickel plated to form a chuck top conductive layer.

Thereafter, the chuck top conductive layer was polished such that the amount of warping of the wafer-placing surface of the chuck top conductive layer was 10 μm and surface roughness Ra of the surface of the chuck top conductive layer was 0.02 μm.

Furthermore, an electromagnetic shielding electrode layer made of stainless steel sandwiched between micas was attached to the chuck top. In addition, a heating element structured such that stainless steel etched in a prescribed pattern is sandwiched between micas was attached.

Then, a cylinder-like, mullite-alumina composite having a diameter of 310 mm and a thickness of 40 mm was prepared as a support body. The support body was spot-faced with a diameter of 285 mm and a depth of 20 mm, so that a hollow cavity portion was formed inside the support body. In addition, a through hole was formed in the support body. An electrode for supplying power to the heating element was installed in the through hole. Then, aluminum was thermally sprayed so that a metal layer was formed on the entire outer surface of the support body and the entire surface of the inner wall surface of the cavity portion.

Furthermore, a variety of disk-shaped reflection plates made of materials as shown in Table 1 were prepared, each having a diameter of 290 mm and a thickness of 1 mm. Then, as shown in FIG. 1, each of various reflection plates 10 as described above was installed on strut 11 provided on surface 4c of base portion 4a of support body 4.

Then, chuck top 2 and side portion 4b of support body 4 fabricated in the foregoing manner were joined to each other as shown in FIG. 1, whereby cavity portion 5 was formed between chuck top 2 and surface 4c of base portion 4a of support body 4 which opposes chuck top 2. Thus, wafer holding bodies No. 1-No. 7 as shown in Table 1 were fabricated each having reflection plate 10 installed in cavity portion 5. Here, distance $L_1$ between surface 10a of reflection plate 10 opposing chuck top 2 and surface 2a of chuck top 2 opposing reflection plate 10 was set at 5 mm.

It is noted that wafer holding body No. 4 was formed without provision of reflection plate 10 and strut 11. Wafer holding body No. 5 used a reflection plate formed by applying nickel plating on the surface of a stainless steel plate.

Then, for wafer holding bodies No. 1-No. 7, the heating element attached to the chuck top was supplied with power so that the temperature of the wafer-placing surface was heated to 200° C. and kept for three hours. Thereafter, the temperature of the base portion of the support body was measured. The result is shown in Table 1.

TABLE 1

| Wafer Holding Body | Material of Reflection Plate | Emissivity of Reflection Plate | Surface Roughness Ra (μm) of Reflection Plate | Temperature (° C.) of Base Portion of Support Body |
|---|---|---|---|---|
| No. 1 | stainless steel | 0.2 | 0.1 | 120 |
| No. 2 | alumina | 0.6 | 0.1 | 135 |
| No. 3 | stainless steel | 0.4 | 1.0 | 125 |
| No. 4 | — | — | — | 152 |
| No. 5 | stainless steel/ Ni plating | 0.1 | 0.1 | 115 |
| No. 6 | stainless steel | 0.5 | 1.5 | 140 |
| No. 7 | aluminium | 0.1 | 0.1 | 113 |

As shown in Table 1, in wafer holding bodies Nos. 1-3 and Nos. 5-7 each provided with a reflection plate, the temperature rise in the base portion of the support body can be suppressed as compared with wafer holding body No. 4 that is not provided with a reflection plate.

Furthermore, as shown in Table 1, the temperature rise of the base portion of the support body can be further suppressed when the emissivity of the reflection plate is 0.4 or less and the surface roughness Ra of the reflection plate is 1 μm or less.

(Experiment 2)

Using wafer holding body No. 1 in Experiment 1, the length of strut 11 that supports reflection plate 10 shown in FIG. 1 was varied in order to vary distance $L_1$ between surface 10a of reflection plate 10 and surface 2a of chuck top 2 and distance $L_2$ between surface 10b of reflection plate 10 and surface 4c of base portion 4a of support body 4 as shown in Table 2. Then, the temperature of base portion 4a of support body 4 was measured in a manner similar to Experiment 1. The result is shown in Table 2.

TABLE 2

| Distance $L_1$ (mm) between Reflection Plate and Chuck Top | Distance $L_2$ (mm) between Reflection Plate and Base Portion of Support Body | Temperature (° C.) of Base Portion of Support Body |
|---|---|---|
| 0.5 | 18.5 | 142 |
| 1 | 18 | 130 |
| 5 | 14 | 120 |
| 9.5 | 9.5 | 115 |
| 14 | 5 | 118 |
| 18 | 1 | 128 |
| 18.5 | 0.5 | 141 |

As shown in Table 2, when each of distance $L_1$ between surface 10a of reflection plate 10 and surface 2a of chuck top 2 and distance $L_2$ between surface 10b of reflection plate 10 and surface 4c of base portion 4a of support body 4 as shown in FIG. 1 is 1 mm or more, the temperature rise of base portion 4a of support body 4 can be suppressed.

(Experiment 3)

Using wafer holding body No. 1 in Experiment 1, metal layers made of the materials shown in Table 3 were formed at respective places shown in Table 3 of the inner wall surface of the cavity portion of the support body in the formation methods as shown in Table 3, resulting in wafer holding bodies Nos. 9-17 shown in Table 3. In addition, wafer holding body No. 8 shown in Table 3 was fabricated with no metal layer formed on the inner wall face of the cavity portion of the support body. Then, for wafer holding bodies Nos. 8-17 shown in Table 3, the temperature of the base portion of the support body was measured in a manner similar to Experiment 1. The result is shown in Table 3.

TABLE 3

| Wafer Holding Body | Material of Metal Layer | Formation Method of Metal Layer | Formation Place of Metal Layer | Temperature (° C.) of Base Portion of Support Body |
|---|---|---|---|---|
| No. 8 | — | — | — | 120 |
| No. 9 | stainless steel | provision of stainless steel foil | entire inner wall surface of cavity portion | 105 |
| No. 10 | stainless steel | provision of stainless steel foil | only surface of base portion of support body | 110 |
| No. 11 | stainless steel | provision of stainless steel foil | only inner wall surface of side portion of support body | 113 |
| No. 12 | nickel | Ni plating | entire inner wall of cavity portion | 105 |
| No. 13 | stainless steel/ nickel | provision of stainless steel foil/ Ni plating | entire inner wall surface of cavity portion | 100 |
| No. 14 | aluminium | thermal spraying | entire inner wall surface of cavity portion | 110 |
| No. 15 | aluminium | thermal spraying | only surface of base portion of support body | 114 |
| No. 16 | aluminium/ nickel | thermal spraying/ Ni plating | entire inner wall surface of cavity portion | 105 |
| No. 17 | titanium/platinum/ gold | vapor deposition | entire inner wall surface of cavity portion | 103 |

As shown in Table 3, in wafer holding bodies Nos. 9-17 each having a metal layer formed on at least a part of the inner wall surface of the cavity portion of the support body, the temperature rise in the base portion of the support body can be suppressed as compared with wafer holding body No. 8.

(Experiment 4)

First, two copper (oxygen-free copper) plates were prepared and a channel was formed by providing a groove in one of the copper plates. Then, this copper plate and the other copper plate, and a stainless steel pipe serving as an inlet/outlet port of fluid were joined to each other by soldering, and the entire surface thereof was nickel plated, resulting in a cooling portion. Then, this cooling portion was installed between the reflection plate and the base portion of the support body in wafer holding body No. 1 in Experiment 1.

Then, the chuck top was heated to 200° C., and the cooling portion in which a cooling fluid flows in the channel was pressed together with the reflection plate against the chuck top. A comparison was then made of the time required for the temperature of the chuck top to decrease from 200° C. to 50° C.

As a result, when water was fed into the channel of the cooling portion, the required time described above was 7 minutes. When air is fed into the channel of the cooling portion, the time was 20 minutes. Without provision of the cooling portion, it took 60 minutes or longer.

(Experiment 5)

Using wafer holding body No. 1 in Experiment 1, a copper cooling pipe having an outer diameter of 8 mm and an inner diameter of 6 mm was attached to the back surface of base portion 4a of support body 4 (that surface of base portion 4a which is opposite to surface 4c of base portion 4a) or surface 10b of reflection plate 10 shown in FIG. 1. Thus, wafer holding bodies Nos. 19-22 shown in Table 4 were fabricated. It is noted that wafer holding body No. 18 was fabricated without provision of the cooling pipe.

Here, in wafer holding bodies Nos. 19-22, the cooling pipe was installed in such as manner that it was folded concentrically with a diameter having approximately the same size as the inner diameter of cavity portion 5 of support body 4.

Then, with air or water as a cooling fluid fed into the cooling pipe for wafer holding bodies Nos. 19-22, and without air or water fed for wafer holding body No. 18, the temperature at the base portion of the support body was measured in a manner similar to Experiment 1. The result is shown in Table 4.

TABLE 4

| Wafer Holding Body | Installation Place of Cooling Pipe | Cooling Fluid | Temperature (° C.) of Base Portion of Support Body |
|---|---|---|---|
| No. 18 | — | — | 120 |
| No. 19 | back surface of base portion of support body | air | 103 |
| No. 20 | back surface of base portion of support body | water | 84 |
| No. 21 | surface of reflection plate | air | 108 |
| No. 22 | surface of reflection plate | water | 87 |

As shown in Table 4, in wafer holding bodies Nos. 19-22 each provided with the cooling portion, the temperature rise in the base portion of the support body can be suppressed as compared with wafer holding body No. 18 that is not provided with the cooling portion.

Furthermore, in wafer holding bodies Nos. 19 and 20 shown in Table 4, holes each having a diameter of 1 mm were formed at 5 mm intervals on the surface of the cooling pipe on the chuck top side. With the air fed into the cooling pipe, the temperature of the base portion of the support body was measured in a manner similar to Experiment 1. As a result, as for wafer holding body No. 19 with the aforementioned holes formed at the cooling pipe, the temperature of the base portion of the support body was 97° C. As for wafer holding body No. 21 with the aforementioned holes formed at the cooling pipe, the temperature of the base portion of the support body was 102° C.

The wafer holding body in accordance with the present invention includes a reflection plate in the cavity portion formed between the chuck top and the base portion of the support body, so that the temperature rise at the bottom of the wafer holding body can be suppressed effectively even when a semiconductor wafer placed at the top of the wafer holding body is heated. Therefore, in accordance with the present invention, the accuracy of the driving system below the wafer holding body can be improved, thereby enabling the accurate probing and also improving throughput.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A heater unit used for a wafer prober for testing a semiconductor wafer, comprising:
    a wafer holding body comprising a chuck top including an electrically conductive layer on a surface thereof and a support body supporting said chuck top, said support body having a base portion opposing said chuck top and a side portion extending from a perimeter of said base portion to said chuck top to support said chuck top,
    wherein a cavity portion is formed between said chuck top and said base portion of said support body and a reflection plate is provided in said cavity portion,
    an emissivity of the surface of the reflection plate opposing the chuck top is at most 0.5,
    a distance between the surface of the reflection plate opposing the chuck top and the surface of the chuck top opposing the reflection plate is at least 1 mm,
    Young's modulus of the support body is 200 GPa or more, and
    a thermal conductivity of the support body is 40 W/mK or less.

2. The heater unit according to claim 1, wherein the emissivity of that surface of said reflection plate which opposes said chuck top is at most 0.5.

3. The heater unit according to claim 1, wherein said reflection plate is made of at least one kind selected from the group consisting of stainless steel, aluminum, and nickel.

4. The heater unit according to claim 1, wherein a distance between that surface of said reflection plate which opposes said chuck top and that surface of said chuck top which opposes said reflection plate, and a distance between that surface of said reflection plate which opposes said base portion of said support body and that surface of said base portion of said support body which opposes said reflection plate each are at least 1 mm.

5. The heater unit according to claim 1, wherein that surface of said reflection plate which opposes said chuck top and that surface of said chuck top which opposes said reflection plate each are circular, and a diameter of that surface of said reflection plate which opposes said chuck top is smaller than a diameter of that surface of said chuck top which opposes said reflection plate.

6. The heater unit according to claim 1, wherein that surface of said reflection plate which opposes said chuck top has flatness of at most 1 mm.

7. The heater unit according to claim 1, wherein that surface of said reflection plate which opposes said chuck top has surface roughness Ra of at most 1 μm.

8. The heating unit according to claim 1, wherein a heating element for heating said chuck top is provided at said chuck top.

9. The heating unit according to claim 1, wherein said support body is shaped like a cylinder with a base.

10. A wafer prober comprising the heater unit according to claim 1.

* * * * *